US009674921B2

United States Patent
Diekmann et al.

(10) Patent No.: US 9,674,921 B2
(45) Date of Patent: Jun. 6, 2017

(54) METHOD FOR OPERATING AN ORGANIC LIGHT-EMITTING COMPONENT AND LIGHTING DEVICE FOR IMPLEMENTING THE METHOD

(71) Applicant: OSRAM OLED GmbH, Regensburg (DE)

(72) Inventors: Karsten Diekmann, Rattenberg (DE); Kilian Regau, Regensburg (DE); Jörg Farrnbacher, Regensburg (DE); Thorsten Vehoff, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 5 days.

(21) Appl. No.: 14/905,774

(22) PCT Filed: Jul. 16, 2014

(86) PCT No.: PCT/EP2014/065262
§ 371 (c)(1),
(2) Date: Jan. 15, 2016

(87) PCT Pub. No.: WO2015/007782
PCT Pub. Date: Jan. 22, 2015

(65) Prior Publication Data
US 2016/0157323 A1    Jun. 2, 2016

(30) Foreign Application Priority Data

Jul. 16, 2013    (DE) .................. 10 2013 107 530

(51) Int. Cl.
*H05B 33/08*      (2006.01)
*B60Q 1/34*       (2006.01)
(Continued)

(52) U.S. Cl.
CPC .......... *H05B 33/0896* (2013.01); *B60Q 1/34* (2013.01); *H01L 51/504* (2013.01); *H01L 51/5206* (2013.01); *H01L 51/5221* (2013.01)

(58) Field of Classification Search
CPC ............. H01L 51/5206; H01L 51/5221; H01L 51/504; H05B 33/0896; B60Q 1/34
See application file for complete search history.

(56) References Cited

U.S. PATENT DOCUMENTS

| 9,105,863 B2 | 8/2015 | Goeoetz et al. |
| 2011/0049730 A1 | 3/2011 | Schmid et al. |

(Continued)

FOREIGN PATENT DOCUMENTS

| DE | 102005059492 A1 | 6/2007 |
| DE | 102010029848 A1 | 1/2012 |

(Continued)

OTHER PUBLICATIONS

Ruiz, D.F., "Sistemas Electrónicos para la Caracterización de la Conductividad y Electroluminiscencia de Materiales Inorgánicos y Poliméricos (Electronic Systems for the Characterization of Conductivity and Electroluminescence of Inorganic and Polymeric Materials)," Tesis Doctoral, Universidad Politécnica de Valencia, Nov. 2010, 316 pages.

*Primary Examiner* — Jany Richardson
(74) *Attorney, Agent, or Firm* — Slater Matsil, LLP

(57) ABSTRACT

A method can be used for operating an organic light-emitting component. The organic light-emitting component has a first electrode and a second electrode, between which an organic functional layer stack with at least one organic light-emitting layer is arranged. The first and second electrodes and the organic functional layer stack have a large area. Electrical contact is made with the first electrode via at least two electrical connection elements in the peripheral regions, in which different electric voltages are applied to the at least (Continued)

two electrical connection elements and the different electric voltages vary over time. A lighting device for implementing the method is also specified.

16 Claims, 14 Drawing Sheets

(51) Int. Cl.
*H01L 51/50* (2006.01)
*H01L 51/52* (2006.01)

(56) References Cited

U.S. PATENT DOCUMENTS

| | | |
|---|---|---|
| 2011/0114992 A1 | 5/2011 | Schmid et al. |
| 2011/0121354 A1 | 5/2011 | Schmid et al. |
| 2012/0091923 A1 | 4/2012 | Kastner-Jung et al. |
| 2013/0127612 A1 | 5/2013 | Stadler et al. |
| 2013/0200358 A1* | 8/2013 | Hartmann ........... H01L 51/5212 257/40 |
| 2014/0225523 A1 | 8/2014 | Coym et al. |
| 2015/0115237 A1 | 4/2015 | Diekmann et al. |

FOREIGN PATENT DOCUMENTS

| | | |
|---|---|---|
| DE | 102011077687 A1 | 12/2012 |
| DE | 102011053902 A1 | 3/2013 |
| DE | 102011119230 A1 | 5/2013 |
| DE | 102011056570 A1 | 6/2013 |
| EP | 2596993 A2 | 5/2013 |
| JP | 2008311118 A | 12/2008 |
| WO | 2010066245 A1 | 6/2010 |
| WO | 2012052886 A2 | 4/2012 |

\* cited by examiner

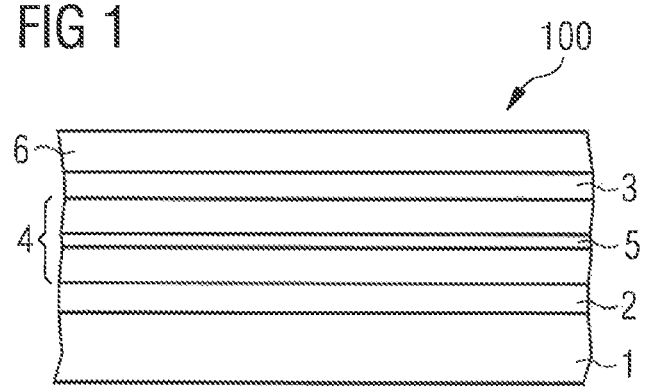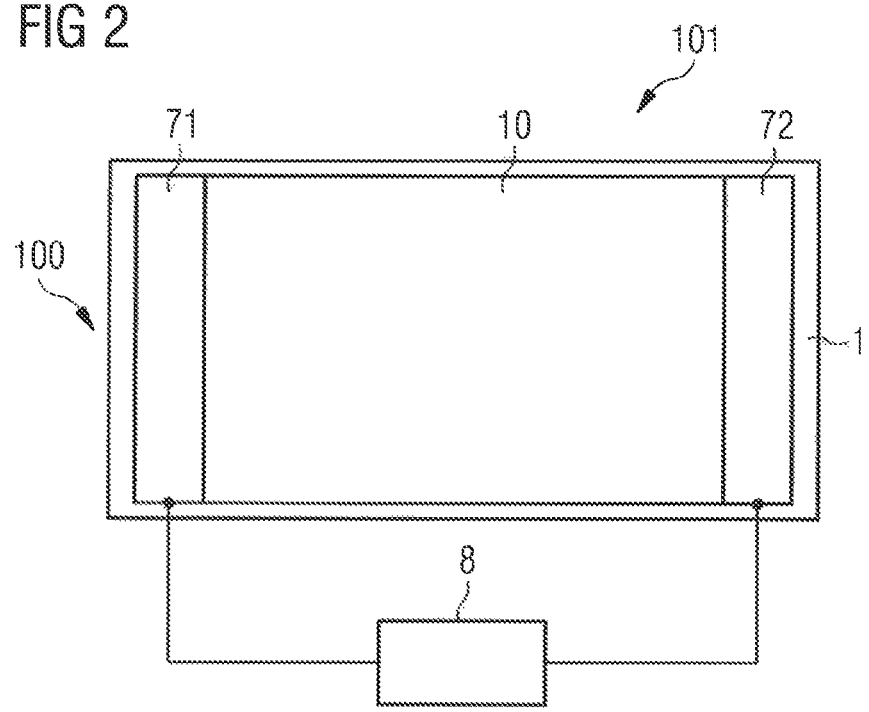

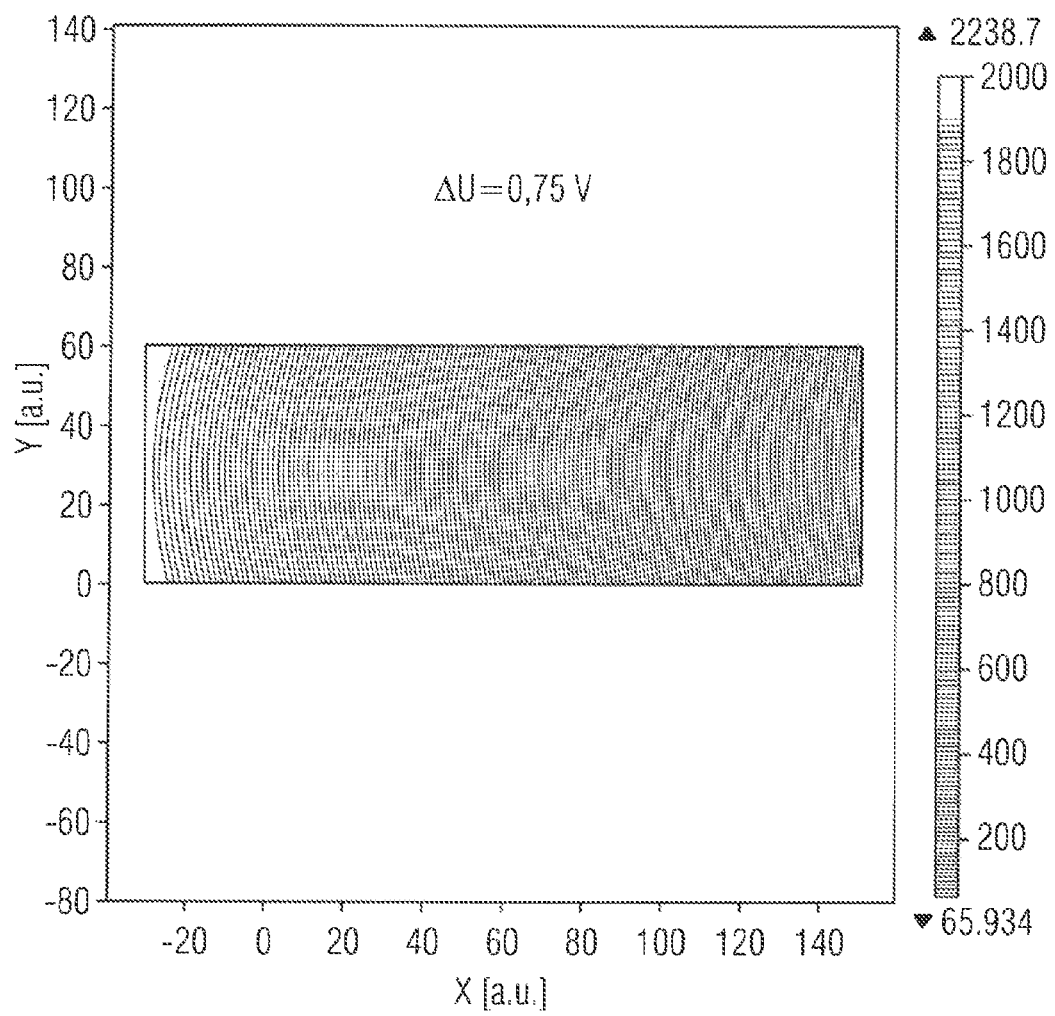

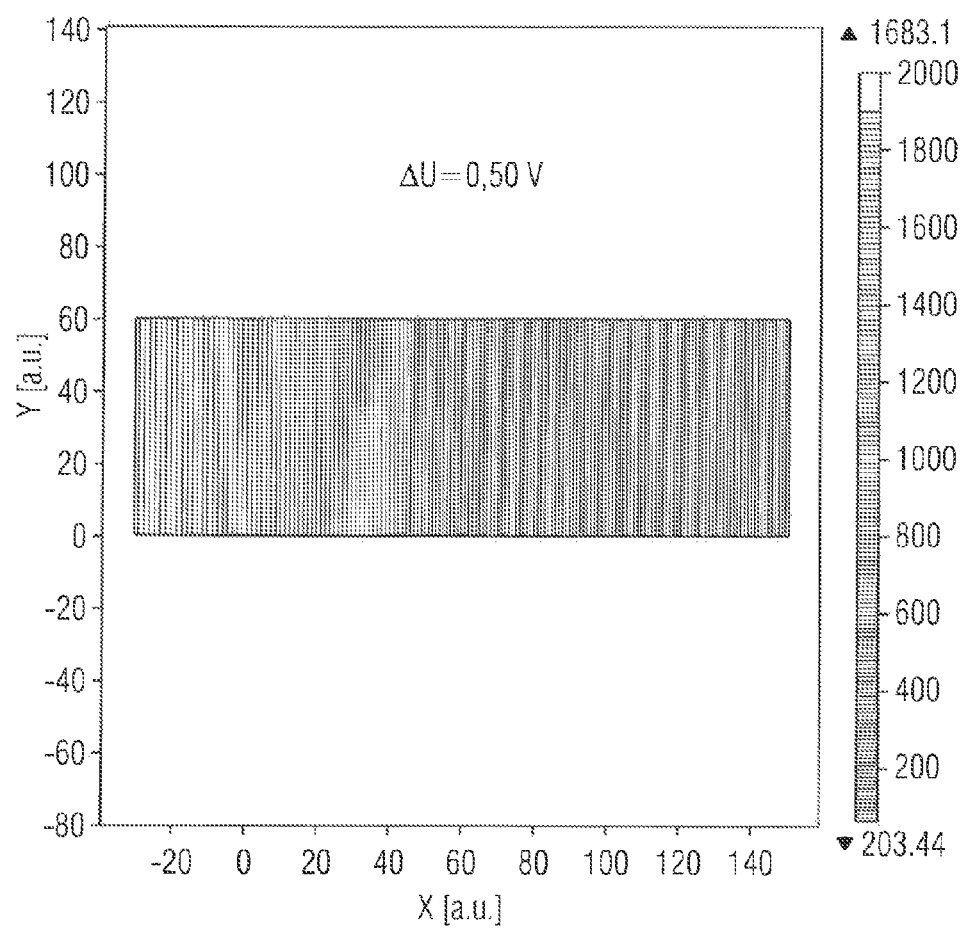

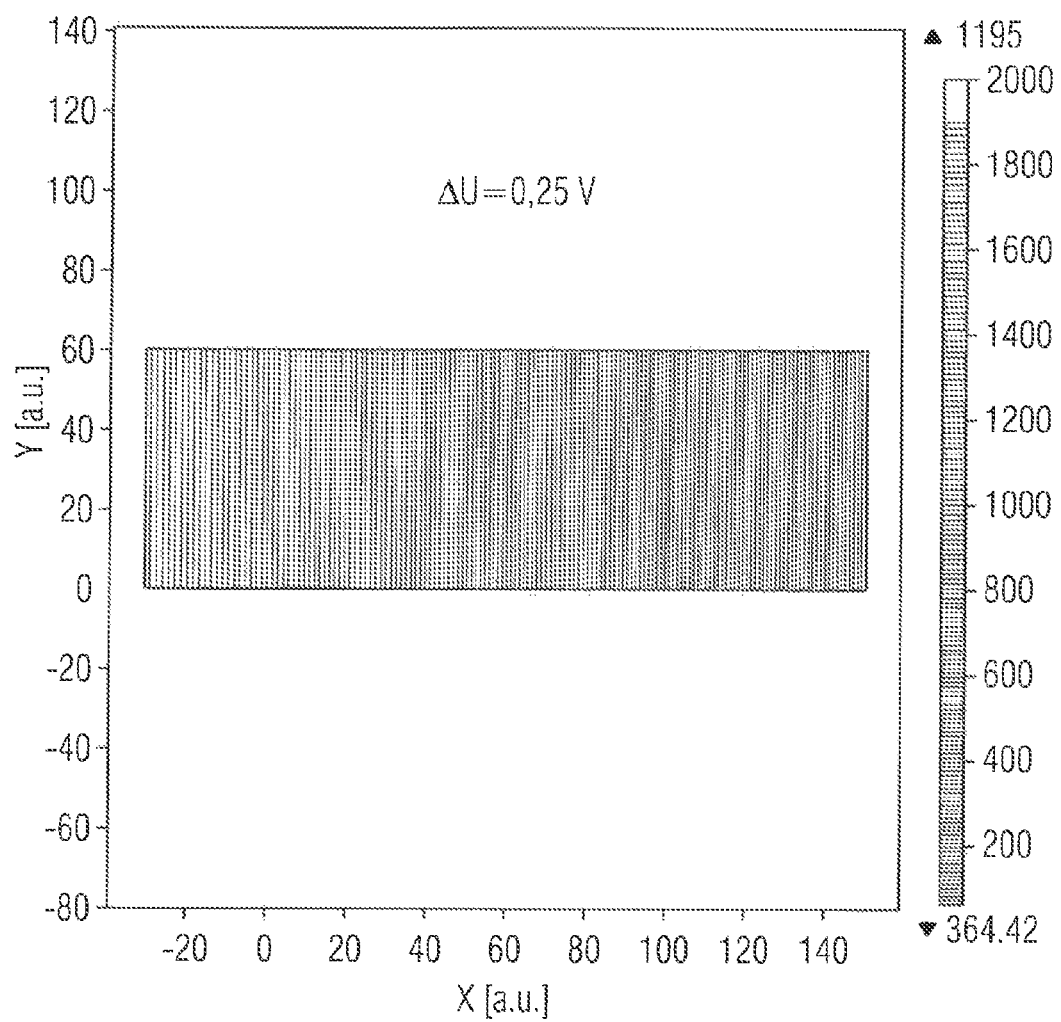

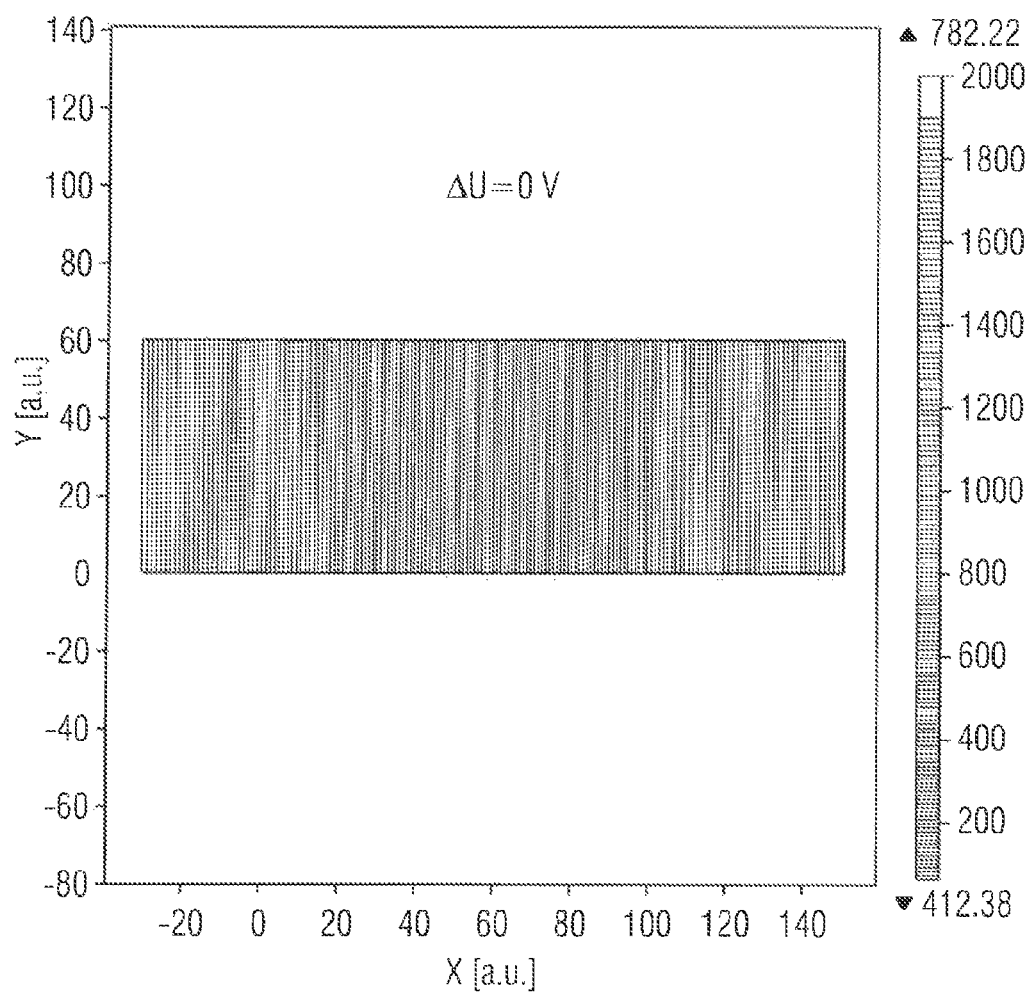

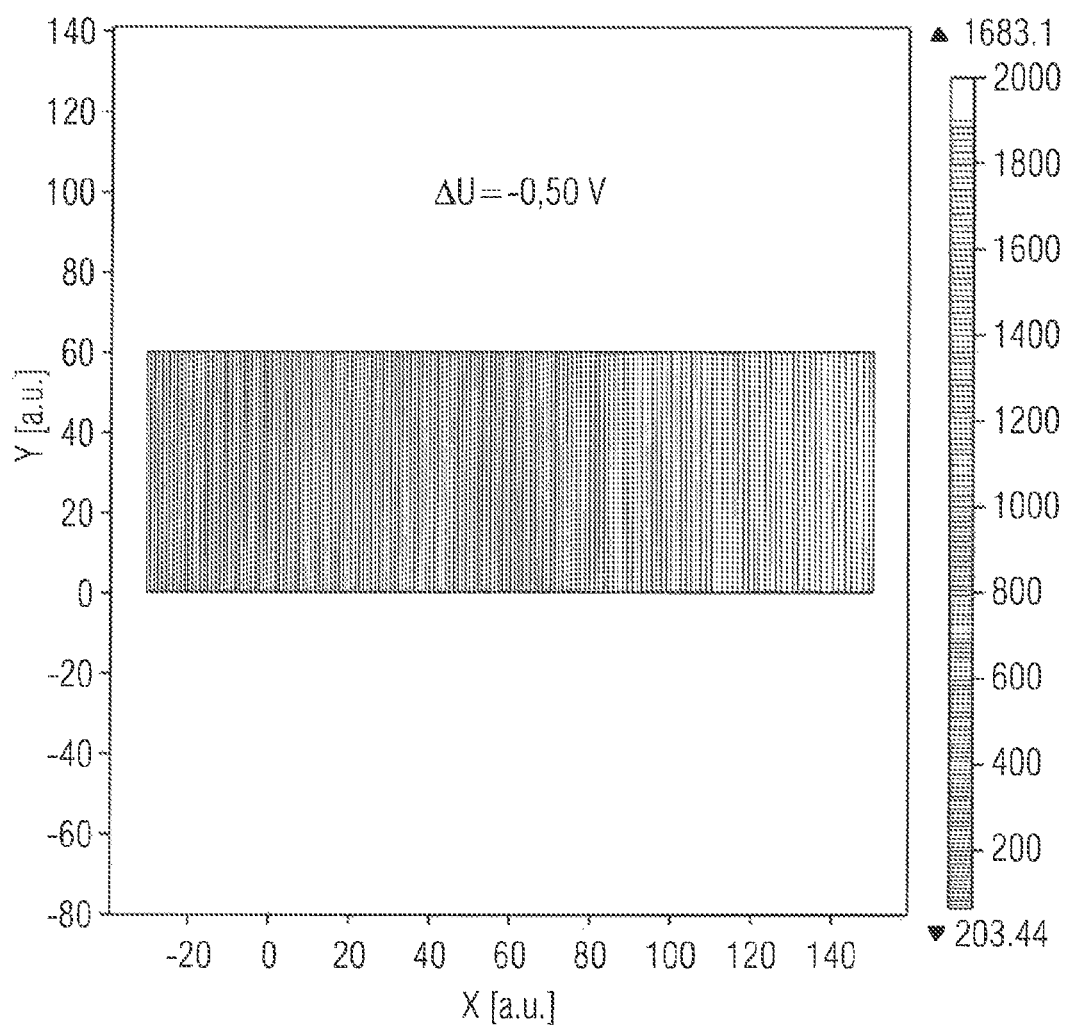

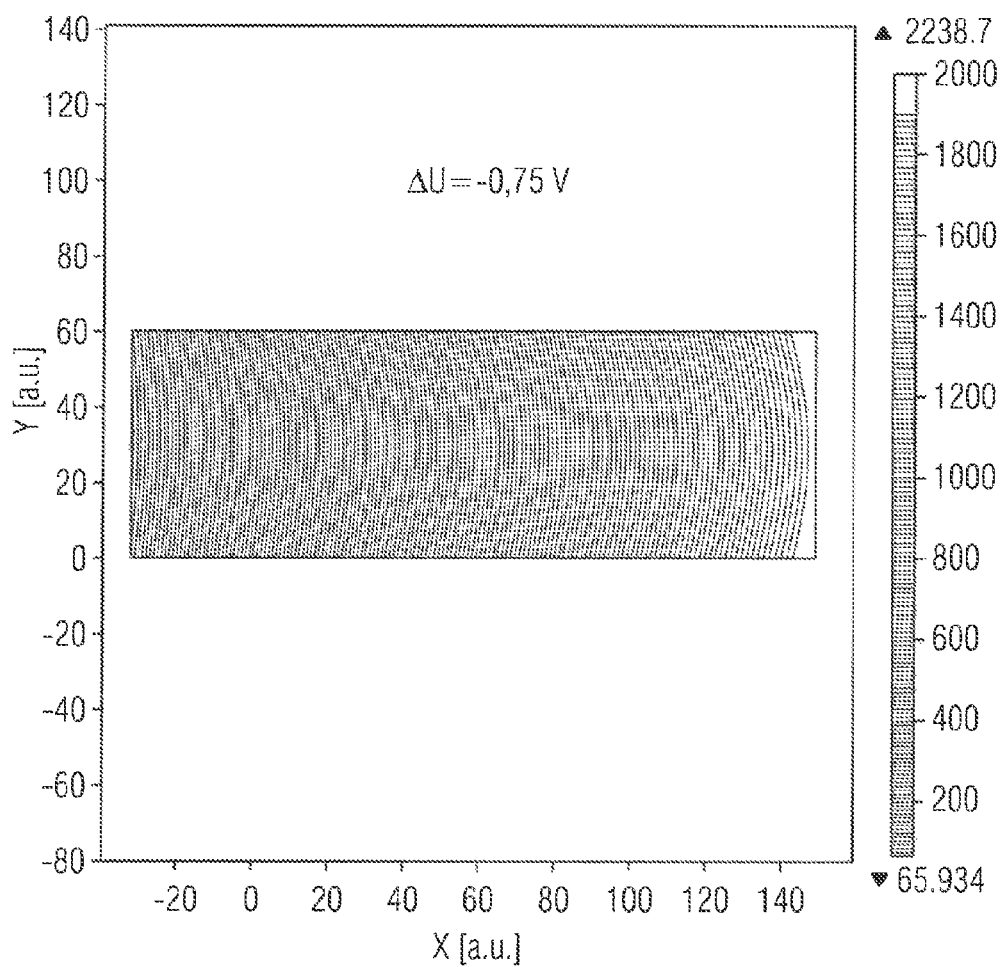

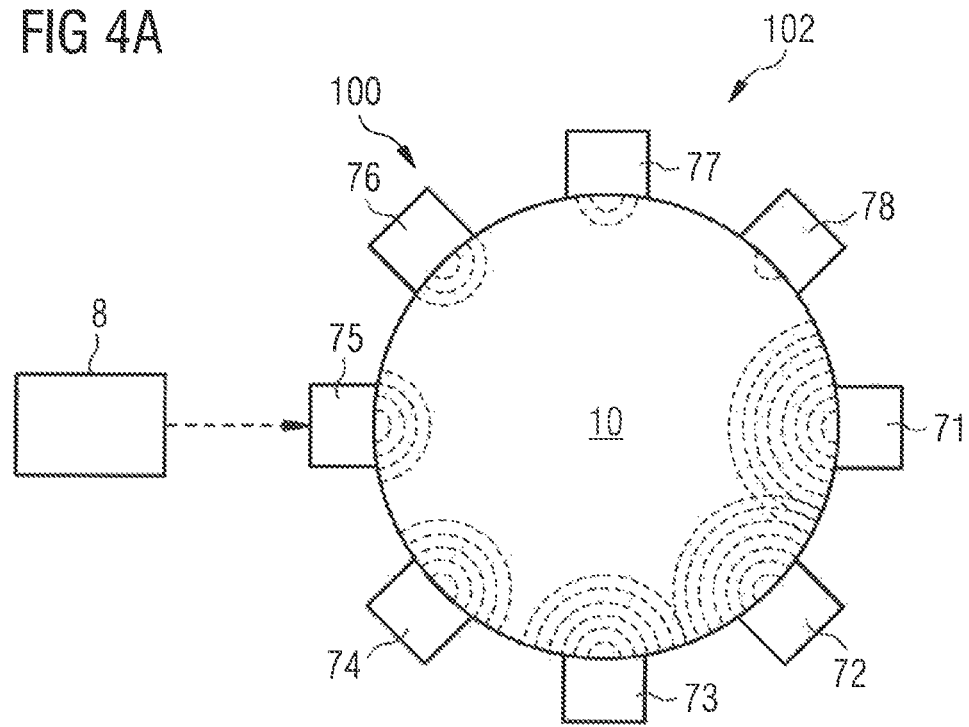
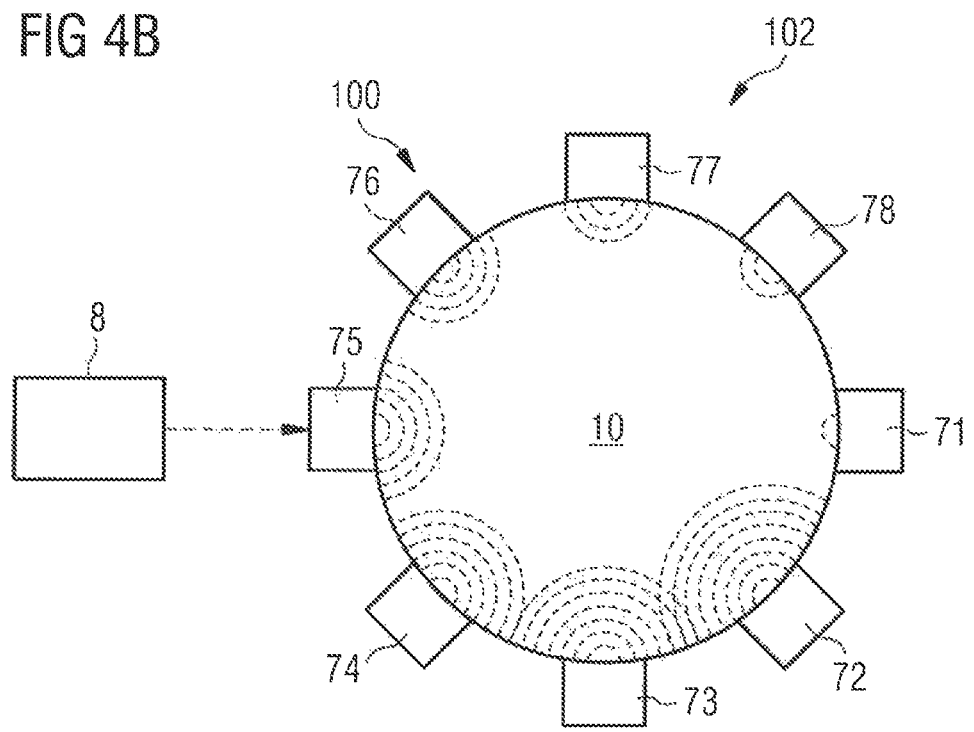

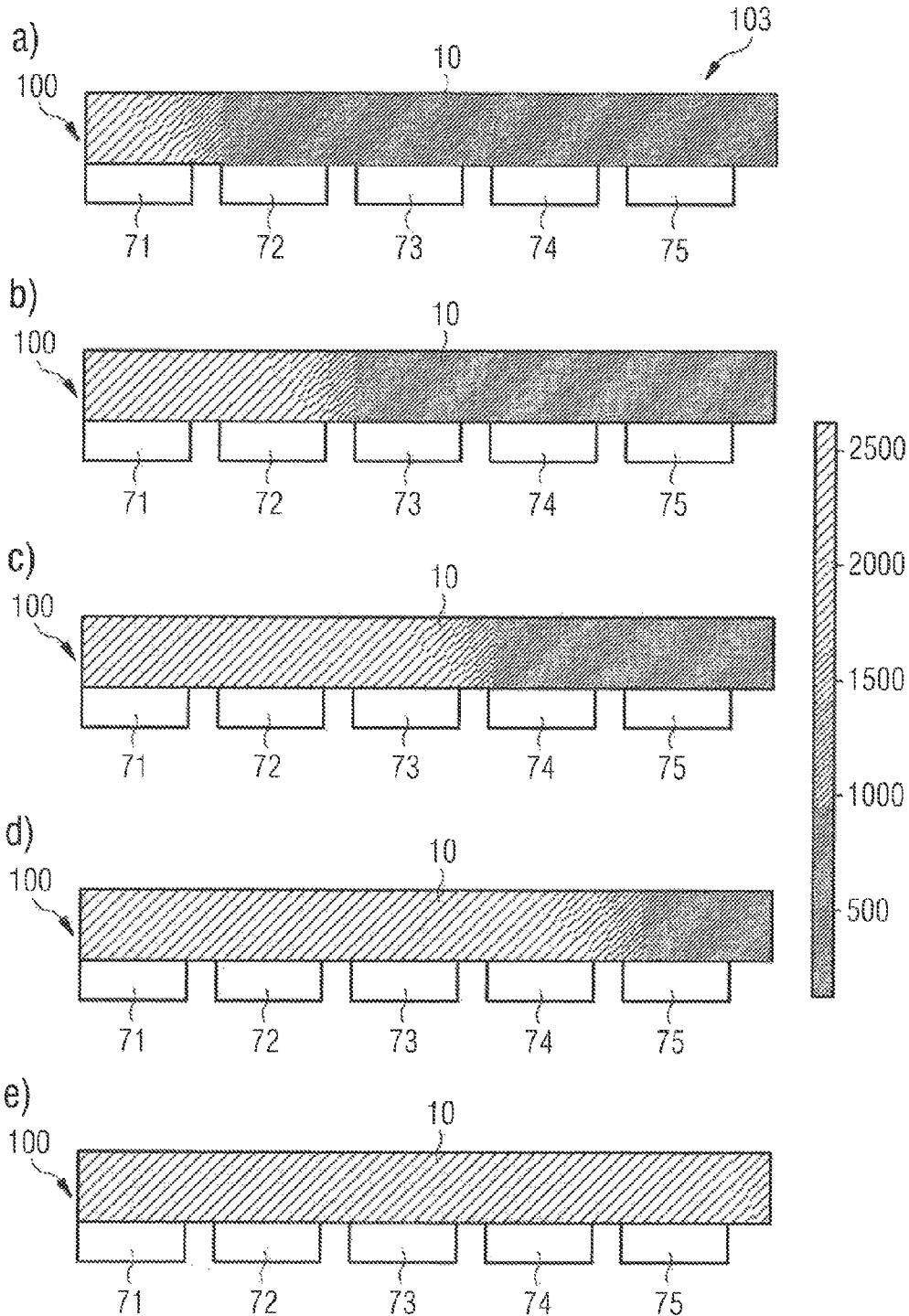

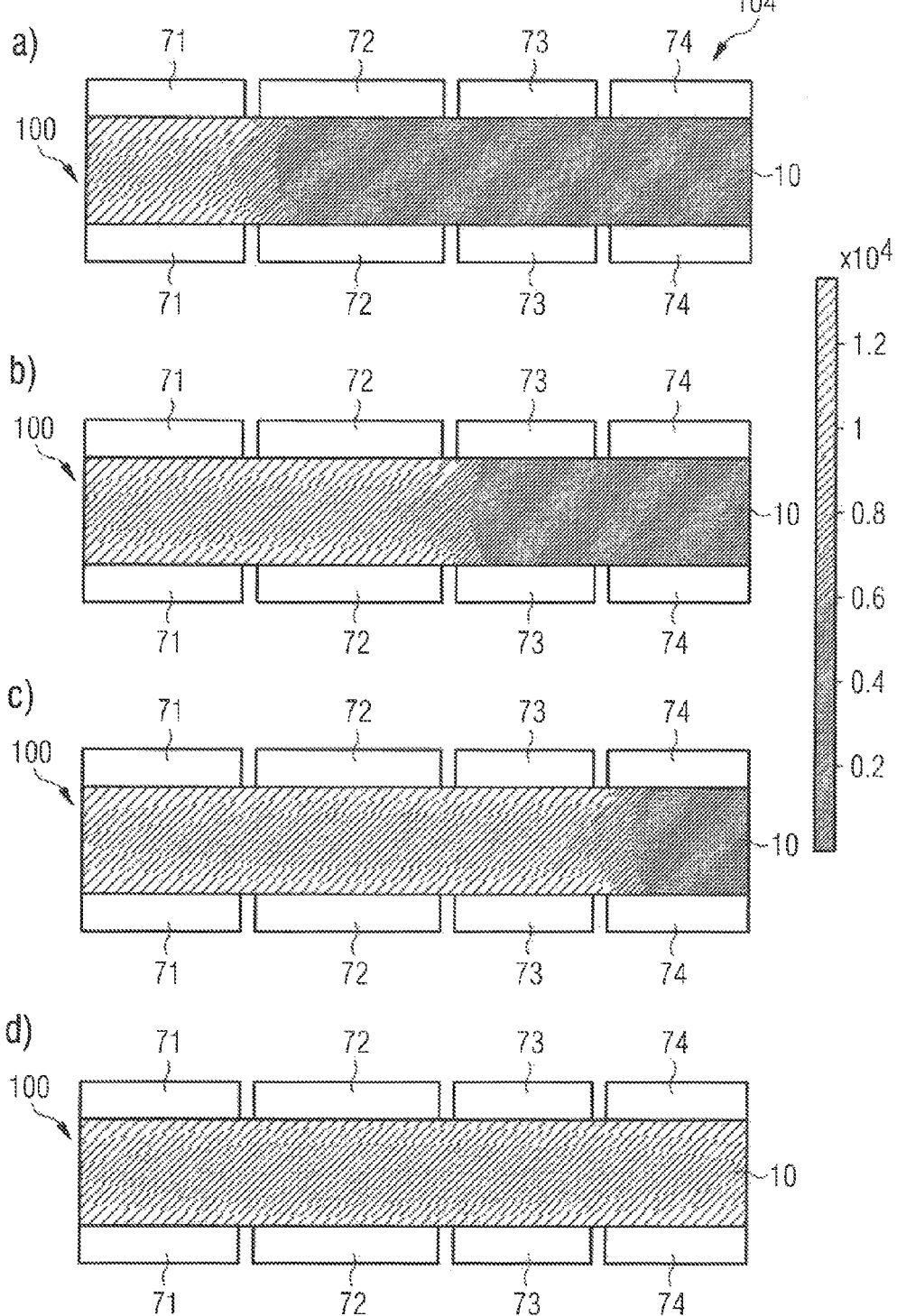

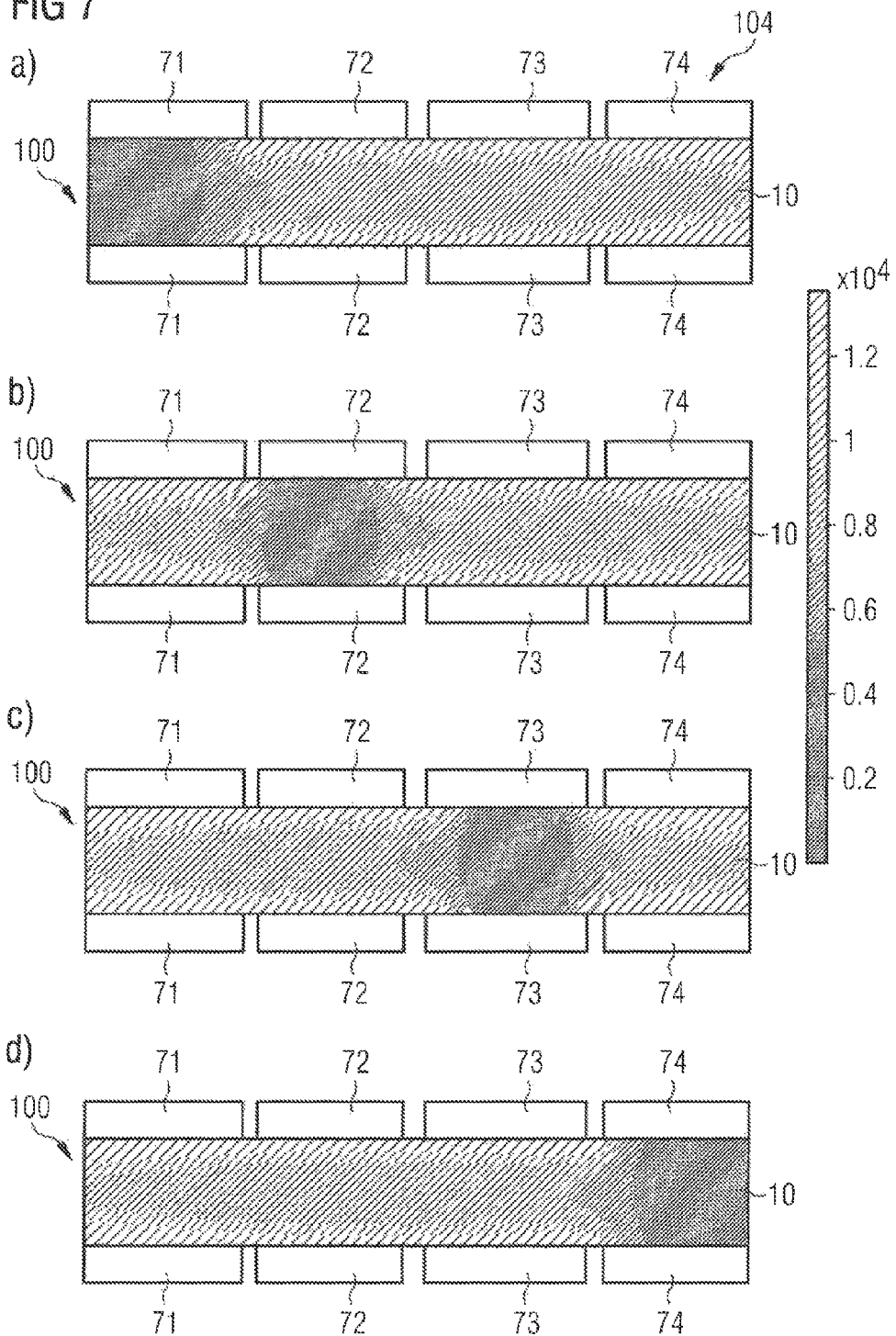

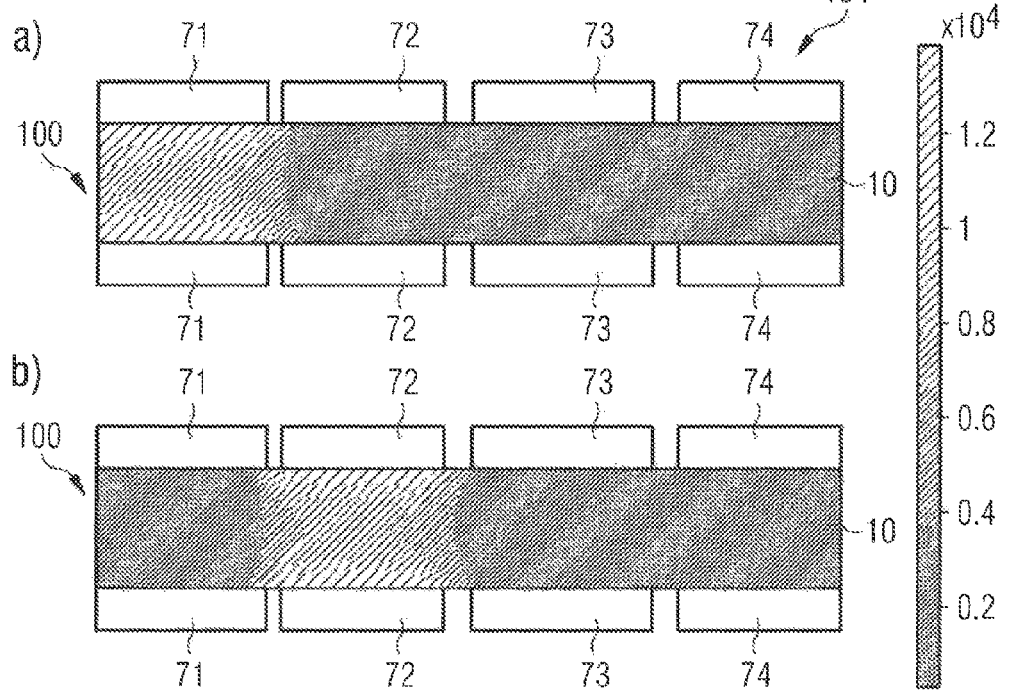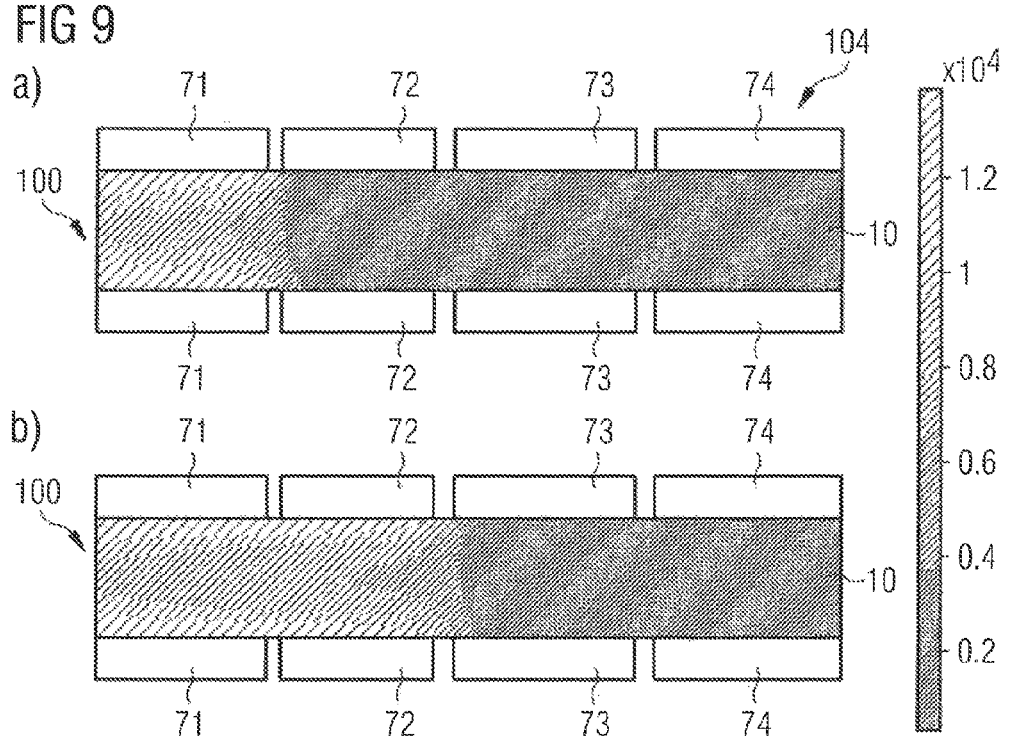

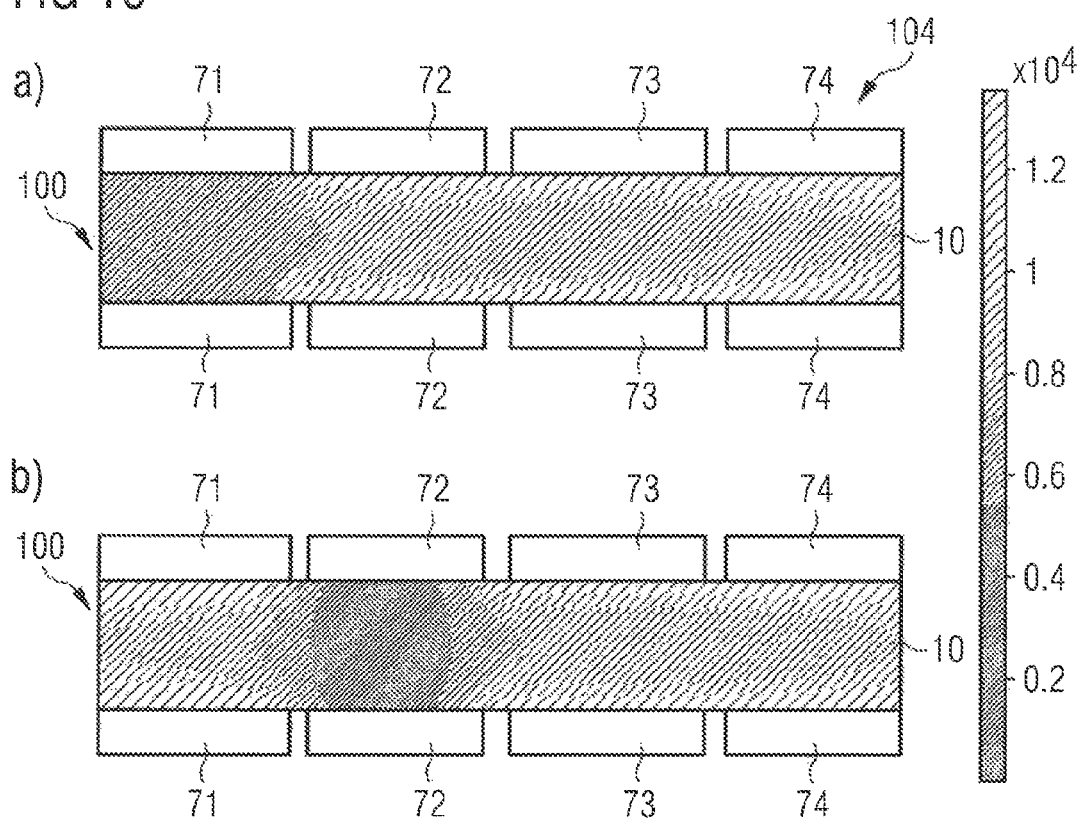

METHOD FOR OPERATING AN ORGANIC LIGHT-EMITTING COMPONENT AND LIGHTING DEVICE FOR IMPLEMENTING THE METHOD

This patent application is a national phase filing under section 371 of PCT/EP2014/065262, filed Jul. 16, 2014, which claims the priority of German patent application 10 2013 107 530.4, filed Jul. 16, 2013, each of which is incorporated herein by reference in its entirety.

TECHNICAL FIELD

A method for operating an organic light-emitting component and a lighting device for implementing the method are described.

SUMMARY

In the method described here and the lighting device described, light is emitted by means of an organic light-emitting component, the light varying temporally over a luminous area of the organic light-emitting component. In particular, the light is emitted by the luminous area with a luminance distribution which is not temporally constant.

There are numerous studies which show that, in the context of lighting, people prefer variable light to conventional static light sources which emit light with a spatially and temporally non-varying luminance distribution. Specific embodiments specify a method for operating an organic light-emitting component wherein a temporal and spatial variation of a luminance distribution of an organic light-emitting component is generated. At least one further embodiment specifies a lighting device for implementing such a method.

In accordance with at least one embodiment, in a method for operating an organic light-emitting component, an organic light-emitting component is provided and used which comprises a first electrode and a second electrode, between which an organic functional layer stack having at least one organic light-emitting layer is arranged.

In accordance with a further embodiment, the organic light-emitting component furthermore comprises a substrate, on which the first electrode and the second electrode are arranged. With the organic functional layer stack arranged between the electrodes, the electrodes and the substrate form a functional layer stack. Here and hereinafter, the "organic functional layer stack" denotes the totality of the organic layers of the organic light-emitting component which are arranged between the electrodes, while the "functional layer stack" at least also comprises the electrodes and the substrate in addition to the organic functional layer stack. The organic light-emitting component can be embodied, in particular, as an organic light-emitting diode (OLED) comprising an electroluminescent layer as organic light-emitting layer.

The organic functional layer stack can comprise layers comprising organic polymers, organic oligomers, organic monomers, organic small, non-polymeric molecules ("small molecules") or combinations thereof. In particular, it can be advantageous if the organic functional layer stack has an organic functional layer embodied as hole transport layer in order to enable an effective hole injection into the light-emitting layer. By way of example, tertiary amines, carbazole derivatives, conductive polyaniline or polyethylene dioxythiophene may prove to be advantageous as materials for a hole transport layer. Materials exhibiting radiation emission on account of fluorescence or phosphorescence, for example, polyfluorene, polythiophene or polyphenylene or derivatives, compounds, mixtures or copolymers thereof, are suitable as materials for the organic light-emitting layer. Furthermore, the organic functional layer stack can comprise a functional layer embodied as electron transport layer. Moreover, the layer stack can also comprise electron and/or hole blocking layers. The organic functional layer stack can also comprise a plurality of organic light-emitting layers arranged between the electrodes.

With regard to the fundamental construction of an organic light-emitting component, in this case, for example, with regard to the construction, the layer composition and the materials of the organic functional layer stack, reference is made to the International Patent Publication WO 2010/066245 A1, also published as U.S. Patent Publication No. 2012/0091923 A1, which is hereby expressly incorporated by way of reference in particular with regard to the construction, the layer composition and the materials of an organic light-emitting component.

The electrodes and the organic functional layer stack are in each case embodied in a large-area fashion. As a result, the organic light-emitting component comprises a continuous luminous area that is not structured into functional partial regions. In particular, the luminous area is not a luminous area segmented into functional regions or a luminous area formed by a multiplicity of pixels. A large-area emission of the light generated in the organic light-emitting layer can be possible as a result. In this case, "large-area" can mean that the organic light-emitting component, and in particular the organic light-emitting layer, has an area, particularly preferably a continuous area, of greater than or equal to a few square millimeters, preferably greater than or equal to one square centimeter, and particularly preferably greater than or equal to one square decimeter.

Particularly preferably, the organic light-emitting component can comprise only a single continuous luminous area brought about by the large-area and continuous embodiment of the electrodes and of the organic functional layer stack.

In accordance with a further embodiment, the first electrode is electrically contacted in edge regions by means of at least two electrical connection elements. The at least two electrical connection elements can be arranged alongside one another or else, for example, on opposite sides of the first electrode in edge regions thereof. In this case, the first electrode and also the organic functional layer stack are embodied in such a way that the entire luminous area could be operated, in principle, solely by means of each of the connection elements contacting the first electrode. In other words, the entire luminous area is luminous if an operating current flows between at least one connection element and the second electrode through the organic functional layer stack.

The connection elements can also be designated as so-called edge contacts by virtue of their arrangement in one or a plurality of edge regions of the first electrode. In particular, the connection elements described here are arranged in each case only in an edge region of the first electrode and do not extend over the first electrode and thus into the luminous region of the organic light-emitting component. The connection elements can be arranged as separate contact pieces on the substrate, for example, and can be in electrical contact with the first electrode. Furthermore, it is also possible for the first electrode and the electrical connection elements to be embodied integrally, such that the electrical connection elements can be formed at least partly by the same material as the first electrode. In this case, the electrical connection elements project beyond the organic functional layer stack in the main extension plane of the electrodes and organic layers of the organic functional layer stack or extend at least into regions on the substrate above which no organic layers are present, such that the electrical connection elements are contactable externally. By way of example, the electrical connection elements can form contact areas for bonding contacts, soldering contacts, electrically conductive adhesive contacts or plug contacts. Furthermore, it is also possible for the electrical connection elements to be electrically contacted by means of electrical conductor tracks, which can run on the substrate, and/or by electrical vias, which can extend through the substrate, such that an electrical connection of the organic light-emitting component can be carried out independently of the specific position of the electrical connection elements, for example, at one or a plurality of side edges or a rear side of the substrate.

In particular, the electrical connection elements can be arranged alongside one another in edge regions of the first electrode. Here and hereinafter, alongside one another means, in particular, an arrangement in which two elements are arranged in a manner offset laterally, that is to say in the main extension plane of the first electrode, with respect to one another at the edge of the first electrode. This can involve the same edge or different edges of the first electrode, that is to say, for example, also opposite edges of the first electrode or adjacent edges of the first electrode, which are connected to one another by means of one or a plurality of corners in the case of an angular shape of the first electrode.

In accordance with a further embodiment, the second electrode is contacted by at least one further electrical connection element. It is also possible for at least two or a plurality of electrical connection elements to be provided for contacting the second electrode. The one or the plurality of electrical connection elements can be arranged on the substrate as described for the connection elements for the first electrode.

In accordance with a further embodiment, in the method for operating the organic light-emitting component, different electrical voltages are applied to the at least two electrical connection elements, the electrical voltages varying temporally. Here and hereinafter, electrical voltage at an electrical connection element of the first electrode denotes the electrical potential which is applied relative to the second electrode. Preferably, the second electrode can be at a fixed electrical potential, while the potential which is respectively applied to the electrical connection elements is varied temporally and differently with respect to one another. The fact that the voltages applied to the electrical connection elements are different means, in particular, that the temporal variation of the electrical voltages differs. In this case, however, it may also be possible for the same voltage to be present in each case at the electrical connection elements at a specific point in time. However, the further change in the respectively applied voltage is different with respect to one another.

The respective temporally varying electrical voltage applied to the electrical connection elements, taking account of the sheet resistance of the first electrode and the associated voltage drop in the first electrode depending on a distance of the electrical connection elements, brings about a spatially and temporally varying current density distribution of the current which is impressed in the organic functional layer stack. This brings about a temporally and spatially varying luminance distribution over the luminous area of the organic light-emitting component, since the different voltages at the at least two electrical connection elements bring about different luminances in different area and edge regions of the luminous area and these different luminances preferably change differently from one another over time. Thus, during the operation of the organic light-emitting component, the temporal variation of the different electrical voltages leads to a temporal and spatial variation—perceptible to an external observer—of a luminance distribution of the light emitted by the organic light-emitting component. By means of a suitable choice of the applied voltages, the variation is preferably performed so slowly and with a sufficiently great magnitude that it is perceptible to the human eye. As a result, the organic light-emitting component can emit a variable light, that is to say light having a temporally and spatially varying luminance distribution which in lighting applications is often perceived as more pleasant than a luminance distribution which is temporally and spatially as homogeneous and constant as possible. By way of example, a sensation of cloud movements or the flickering of candles or flames can be engendered for an observer. In particular, temporal changes with a frequency of less than or equal to 10 Hz or less than or equal to 5 Hz and greater than or equal to 0.5 Hz can be particularly suitable.

The temporally and spatially varying luminance distribution can be generated by the method described here, without the need to implement complex structural measures at the organic light-emitting component. In contrast thereto, in the prior art hitherto there have been two different approaches for achieving temporally variable homogeneities in organic light-emitting components. Firstly, there is a display approach, wherein the luminous area is formed by rows and columns of individually drivable segments, which allows arbitrarily complex images to be represented. In this case, the resolution depends on the number of rows and columns. However, this approach is expensive and corresponding organic light-emitting components usually have to be produced in a complex production method. As a result of the segmentation into a multiplicity of individual independent luminous areas or luminous points, the achievable luminance of such display-like organic light-emitting components is often insufficient for lighting purposes. A further approach consists, for example, in contacting the area of an electrode such as the anode, for example, at some locations not only at the edge but also in the center. A corresponding component is described in the International Patent Publication WO 2012/052886 A2 wherein contact holes are produced from the cathode to the underlying anode by means of so-called laser drilling, the contact holes then being contacted by contact elements. As a result, it is possible to introduce different amounts of current at different locations of the anode and, consequently, to achieve non-uniform homogeneities. In order to represent shapes, the anode area can in this case also be subdivided into separately drivable segments. However, the production of contacts not only at the edge but also on the area and, for example, in the center of an electrode can be realized only by means of complex additional method steps during production.

In contrast to the prior art, the organic light-emitting component described here comprises a luminous area which is free of electrical contacts on the area and at a distance from the edge of the first electrode. Consequently, in the case of the organic light-emitting component described here, it is not necessary to structure the luminous area or to fit additional contacts within the edge in the center of the luminous area. Instead, temporally varying homogeneities of the luminance distribution are generated by variable voltages at the separately drivable electrical connection elements in edge regions of the first electrode. Each of the electrical connection elements feeds, however, into the entire first electrode and thus into the same luminous area.

In accordance with a further embodiment, the first electrode has a higher electrical sheet resistance than the second electrode. Whereas in customary organic light-emitting components that emit as homogeneously as possible it is a constant endeavor to minimize the sheet resistance of the electrodes, a certain sheet resistance of the first electrode that is not too low is advantageous in the case of the organic light-emitting component described here. By way of example, it can be advantageous if the first electrode has an electrical sheet resistance that is at least ten times, and preferably at least a hundred times, greater than that of the second electrode. The electrical sheet resistance that is to be chosen such that it is not too low can bring about a desired voltage drop in the first electrode proceeding from the electrical connection elements with increasing distance therefrom, as a result of which a spatially inhomogeneous luminance distribution of the luminous area of the organic light-emitting component can arise even in the case of a temporally invariable voltage respectively applied to the electrical connection elements.

By way of example, the first electrode can comprise a transparent conductive oxide, while the second electrode comprises a metal. In particular, the first electrode can be formed by a transparent conductive oxide or at least comprise a layer formed by a transparent conductive oxide, while the second electrode is formed by a metal or comprises at least one layer formed by a metal.

Preferably, the sheet resistance of the first electrode can be in a range of greater than or equal to 1 Ω/sq or greater than or equal to 5 Ω/sq and less than or equal to 50 Ω/sq or less than or equal to 10 Ω/sq. The sheet resistance of the first electrode can be adjustable, for example, by way of the material selection and/or by way of the thickness of the first electrode.

Transparent conductive oxides (TCOs) are transparent conductive materials, generally metal oxides, such as, for example, zinc oxide, tin oxide, cadmium oxide, titanium oxide, indium oxide or indium tin oxide (ITO). Alongside binary metal-oxygen compounds such as, for example, ZnO, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p- or n-doped.

The metal of the second electrode can preferably be selected from aluminum, barium, indium, silver, gold, magnesium, calcium and lithium and compounds, combinations and alloys thereof. In particular, the second electrode can comprise Ag, Al or alloys with the latter, for example, Ag:Mg, Ag:Ca, Mg:Al. In addition, the second electrode can also comprise one or a plurality of the TCO materials mentioned above. The second electrode can be chosen with regard to its thickness and its composition, for example, such that it has a lower sheet resistance than the first electrode. Particularly the thickness of a metallic second electrode can have a magnitude such that the second electrode is not transparent and is furthermore at least partly reflective. An at least partly transparent second electrode having a low sheet resistance can also be formed by means of a combination of metal and TCO layers.

As an alternative to a TCO, the first electrode can also comprise or be formed from a transparent metal. Here and hereinafter, a transparent metal is understood to mean a metal layer having such a small thickness that at least part of the light generated by the organic light-emitting component during operation can be radiated through the metal layer. The thickness of a transparent metal layer can be from a few nanometers to 30 nm, for example, depending on the material and the light to be radiated through.

In accordance with a further embodiment the second electrode has a sheet resistance that is substantially identical to the sheet resistance of the first electrode. In this case, "substantially identical" means that the sheet resistance of the first electrode has a value that is less than one order of magnitude, preferably less than five times, and particularly preferably less than two times, greater than the sheet resistance of the second electrode. Particularly preferably, the sheet resistances of the first and second electrodes can be identical. By way of example, the first and second electrodes in this case can be transparent and/or comprise an identical material or be embodied identically. If both electrodes have a substantially identical sheet resistance, then the first electrode preferably has a sheet resistance value mentioned further above.

In accordance with a further embodiment the organic functional layer stack has a high voltage sensitivity. A high voltage sensitivity can be achieved depending on the organic material used, for example, by virtue of the organic functional layer stack comprising at least two organic light-emitting layers between which no charge generating layer in the form of a "charge generation layer" (CGL) known to the person skilled in the art is arranged. By way of example, the at least two organic light-emitting layers can be directly adjacent to one another and adjoin one another. In the case of known OLEDs, a CGL often achieves the effect that the voltage sensitivity decreases, whereas a high voltage sensitivity of the organic functional layer stack may be desirable in the case of the method described here. The at least two organic light-emitting layers can emit, for example, light having the same color, that is to say, for example, both red, yellow, green or blue light. Furthermore, it may also be possible for the at least two organic light-emitting layers to emit differently colored light, for example, red and yellow light or red and green light. Furthermore, it may also be possible, for example, for one light-emitting layer to emit red and green light, while the other light-emitting layer emits blue light.

In accordance with a further embodiment, the organic light-emitting component has a large active area, that is to say a large luminous area. A large luminous area can be, for example, a square area having an edge length of more than 10 cm or of more than 20 cm or of more than 25 cm or of more than 50 cm. Furthermore, the large luminous area can also have a different shape, for example, a rectangular or round shape, having a corresponding surface area. Since the voltage drop depending on the distance with respect to the at least two electronic connection elements rises approximately proportionally to the distance of the connection elements and thus proportionally to the size of the luminous area, an intensification of the luminance inhomogeneity on the luminous area can be achieved by means of an enlargement of the luminous area.

By means of a suitable selection of the sheet resistances of the first and second electrodes, of the voltage sensitivity of the organic functional layer stack and of the size of the luminous area or of the organic light-emitting component, the intensity of the luminance inhomogeneity can be influenced in a targeted manner in the case of the method described here, such that, for example, organic light-emitting components of different sizes exhibit the same luminous intensity and luminous intensity inhomogeneity under the same operating conditions.

In accordance with a further embodiment the variation of the different electrical voltages is chosen in such a way that the average voltage applied to the first electrode remains constant. In the case of a linear current-voltage profile of the organic light-emitting component, in this case the average current impressed on the organic functional layer stack can also be constant, such that even in the case of a linear current-brightness dependence of the at least one organic light-emitting layer the average light intensity emitted by the organic light-emitting component remains constant. Taking account of possible non linearities in the current-voltage profile or in a current-brightness dependence, the different and temporally varying electrical voltages respectively applied to the electric connection elements can likewise be chosen, however, in such a way that the average light intensity emitted by the organic light-emitting component remains constant. As a result, the organic light-emitting component can enable a constant illuminance despite a varying luminance distribution.

In accordance with a further embodiment the electrical voltages applied to the at least two electrical connection elements oscillate. That means, in other words, that the respective electrical voltage applied to each of the electrical connection elements changes periodically between a minimum value and a maximum value, wherein the change in the electrical voltage respectively applied preferably proceeds continuously and in a continuously variable manner or in as continuously variable a manner as possible. By way of example, the voltages respectively applied to the electrical connection elements can have a sine- or cosine-like dependence in terms of the temporal profile. Furthermore, it is also possible for the temporal profile of the electrical voltages respectively applied to form a staircase or sawtooth function. If all the electrical voltages applied to the electrical connection elements oscillate periodically, then the respective temporal profiles preferably have mutually different period durations and/or different temporal phases, such that the changes in the electrical voltage respectively applied to the electrical connection elements differ from one another.

Furthermore, it may also be possible for the electrical voltages applied to the at least two electrical connection elements to be controlled according to a random algorithm. Moreover, a periodic voltage variation can be superimposed with a random variation. As a result, it may be possible, for example, to prevent a familiarization effect or boredom for an external observer. The random algorithm can be selected, for example, with regard to period lengths, minimum or maximum values of the electrical voltages respectively applied to the electrical contact elements, or a combination thereof. It is thereby possible to bring about wavy movements at different speeds, for example, with regard to the luminance distribution.

In accordance with a further embodiment the organic light-emitting component comprises a multiplicity, that is to say at least three or more, of electrical connection elements in different edge regions of the first electrode. There can be applied to at least one, preferably to a plurality and particularly preferably to each of the multiplicity of electrical connection elements, a temporally varying electrical voltage which is different than the temporally varying electrical voltages applied to the other electrical connection elements.

In accordance with a further embodiment the organic light-emitting component comprises a luminous area having an angular shape. In this case, the at least two electrical connection elements can preferably be arranged at different edges of the first electrode, such that at least one corner of the luminous area is arranged between the at least two electrical connection elements along the edge course of the first electrode.

Furthermore, it is also possible for the organic light-emitting component to comprise a luminous area having a round shape. In this case, it can be possible, for example, for preferably a multiplicity of electrical connection elements to be arranged in a manner spaced apart uniformly along the round shape.

In accordance with a further embodiment the substrate comprises one or a plurality of materials in the form of a layer, a plate, a film or a laminate, which are selected from glass, quartz, plastic, metal, silicon wafer. Particularly preferably, the substrate comprises glass, for example, in the form of a glass layer, glass film or glass plate, or is composed thereof.

In accordance with a further embodiment the substrate and the electrode arranged between the substrate and the organic functional layer stack are embodied as transparent, such that light generated in the at least one light-emitting layer can be emitted through the transparent electrode and the transparent substrate. Such an organic light-emitting component can also be referred to as a so-called "bottom emitter". Particularly preferably, in this case the first electrode is embodied as a transparent electrode between the substrate and the organic functional layer stack.

Furthermore, the electrode arranged on the organic functional layer stack as viewed from the substrate can also be embodied as transparent, such that light generated in the at least one light-emitting layer can be emitted through the transparent electrode in a direction facing away from the substrate. Such an organic light-emitting component can also be referred to as a so-called "top emitter".

Furthermore, it is also possible for both electrodes and the substrate to be embodied as transparent, such that the organic light-emitting component can be embodied as bidirectionally emitting, that is to say emitting on both sides, and can furthermore be pellucid or translucent.

In accordance with a further embodiment the organic light-emitting component comprises an encapsulation over the electrodes and the organic functional layer stack, for example, in the form of a cover, for instance a glass cover or a glass substrate, and/or in the form of a thin-film encapsulation comprising one or a plurality of applied layers which each by themselves or which by interaction with one another afford protection of the organic functional layer stack and of the electrode against damaging substances from the surroundings such as oxygen and/or moisture, for example.

In accordance with a further embodiment a lighting device is provided which is embodied and provided for implementing the above-described method for operating the organic light-emitting component. For this purpose, the lighting device comprises the above-described organic light-emitting component and an electrical component. The electrical component is designed to apply different temporally varying electrical voltages to the at least two electrical connection elements, as described above in association with the method. The electrical component can be embodied as an electrical circuit, for example, also as an integrated electrical circuit (IC: "integrated circuit"), and can be embodied in the form of a separate component independent of the organic light-emitting component. As an alternative thereto, the electrical component can also be integrated in the organic light-emitting component, for example, on a partial region of the substrate or else within the substrate. The temporal variation of the electrical voltage respectively applied to the electrical connection elements can be stored in a preset manner in the electrical component or else be adjustable externally for example, by means of operating elements or control elements.

BRIEF DESCRIPTION OF THE DRAWINGS

Further advantages, advantageous embodiments and developments will become apparent from the exemplary embodiments described below in association with the figures.

In the figures:

FIG. 1 shows a schematic illustration of an organic light-emitting component in accordance with one exemplary embodiment, FIG. 2 shows a lighting device comprising an organic light-emitting component for implementing a method for operating the organic light-emitting component in accordance with a further exemplary embodiment, FIGS. 3A to 3G show simulations of a method for operating an organic light-emitting component in accordance with a further exemplary embodiment, and FIGS. 4A to 10 show lighting devices comprising organic light-emitting components in which methods for operating the respective organic light-emitting component are implemented in accordance with further exemplary embodiments.

Figure 3E:
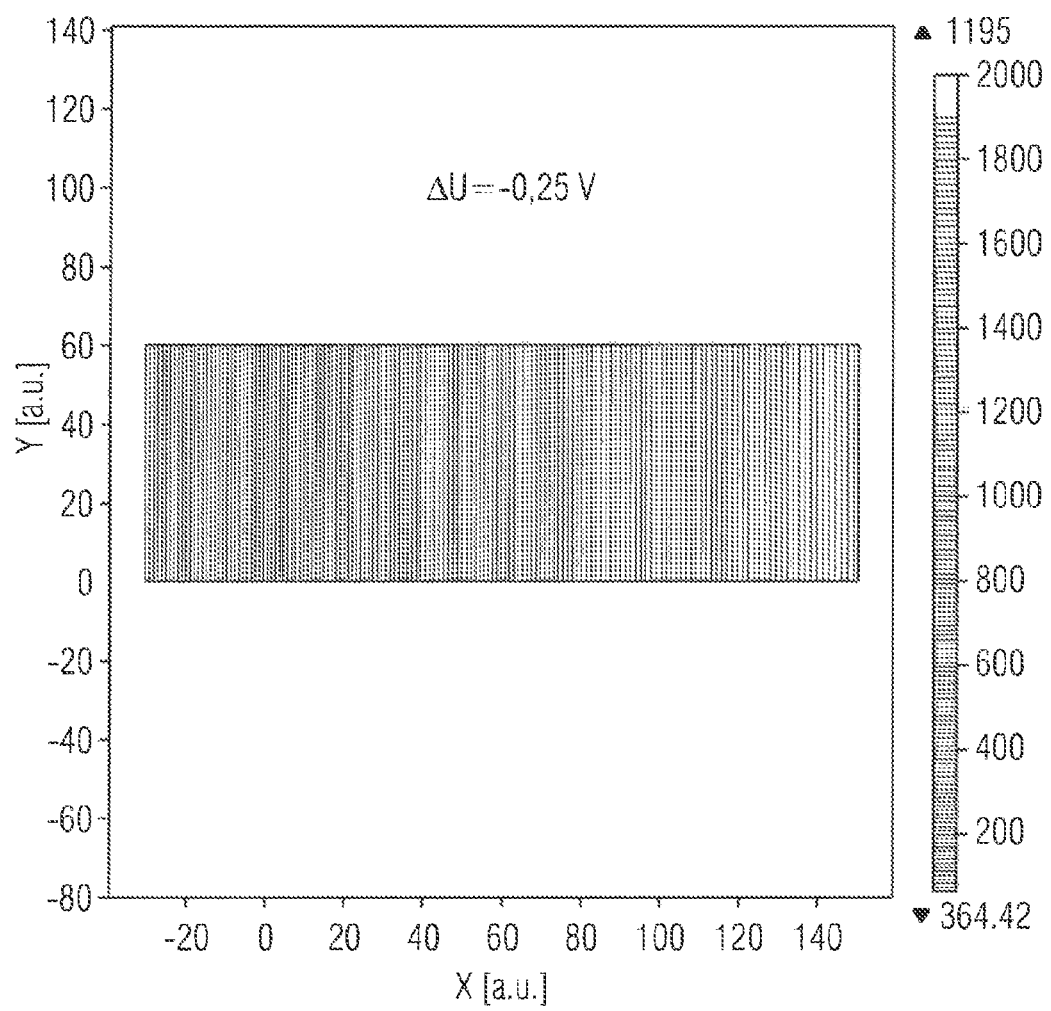

In the exemplary embodiments and figures, elements that are identical, of identical type or act identically can be provided in each case with the same reference signs. The illustrated elements and their size relationships among one another should not be regarded as true to scale; rather, individual elements such as, for example, layers, structural parts, components and regions may be illustrated with exaggerated size in order to enable better illustration and/or in order to afford a better understanding.

DETAILED DESCRIPTION OF ILLUSTRATIVE EMBODIMENTS

FIG. 1 shows an excerpt from the layer construction of an organic light-emitting component 100 in accordance with one exemplary embodiment. The construction of the organic light-emitting component 100 should be understood to be purely by way of example and not restrictive for the following exemplary embodiments.

The organic light-emitting component 100 comprises an organic functional layer stack 4 having at least one organic light-emitting layer 5 between a first electrode 2 and a second electrode 3. The electrodes 2, 3 and the organic functional layer stack 4 are arranged on a substrate 1. In the exemplary embodiment shown, the substrate 1 is embodied as transparent, for example, in the form of a glass plate or glass layer. The first electrode 2 is applied above the latter, the first electrode comprising, for example, a transparent conductive oxide such as ITO, for instance, or some other material mentioned above in the general part for the first electrode.

In the exemplary embodiment in FIG. 1, the second electrode 3 is embodied as reflective and comprises, in particular, a metal mentioned above in the general part, for example, Ag and/or Al. In particular, the first electrode 2 can be embodied as an anode and the second electrode 3 as a cathode, or vice versa. Preferably, the sheet resistance of the first electrode 3 can be in a range of greater than or equal to 1 Ω/sq or greater than or equal to 5 Ω/sq and less than or equal to 50 Ω/sq or less than or equal to 10 Ω/sq. The sheet resistance of the first electrode can be adjustable, for example, by way of the material selection and/or by way of the thickness of the first electrode.

By way of example, the materials and the thicknesses of the first electrode 2 and of the second electrode 3 can be chosen such that the first electrode 2 has a higher electrical sheet resistance than the second electrode 3. For the exemplary embodiments described below, it is particularly advantageous if the first electrode 2 has an electrical sheet resistance at least ten times, and preferably at least a hundred times, greater than that of the second electrode 3. As an alternative or in addition thereto, the organic functional layer stack can have a high voltage sensitivity and/or the organic light-emitting component can have a large area as described in the general part.

In the exemplary embodiment shown, the organic light-emitting component 100 is embodied as a bottom emitter and emits light through the first electrode 2 embodied as transparent and the transparent substrate 1 during operation. By way of example, it is also possible, however, for the organic light-emitting component 100, instead of the bottom emitter configuration shown, to be embodied as a top emitter or as a transparent organic light-emitting component which emits on both sides, as described above in the general part.

The organic functional layer stack 4 having the at least one organic light-emitting layer 5 furthermore comprises, for example, one or a plurality of organic functional layers selected from hole injection layers, hole transport layers, electron blocking layers, hole blocking layers, electron transport layers and electron injection layers, which are suitable for conducting holes and electrons to the at least one organic light-emitting layer 5 or for blocking the respective transport. Furthermore, it is also possible for a plurality of light-emitting layers to be present. Suitable layer constructions for the organic functional layer stack 4 are known to the person skilled in the art and will therefore not be explained in any further detail here.

An encapsulation layer 6 is arranged on the second electrode 3. The encapsulation layer can be applied, for example, directly on the second electrode 3, as is shown in FIG. 1. Furthermore, it is also possible that, between the second electrode 3 and the encapsulation layer 6, further layers, for example, intermediate or protective layers, are arranged or a region in which a gas, a gel or a liquid is situated is provided. In particular, the encapsulation layer 6 can be embodied as a thin-film encapsulation, for example, which comprises one or a plurality of thin layers which taken by themselves or at least jointly can encapsulate the organic functional layer stack 4 and the electrodes 2, 3 as hermetically tightly as possible with respect to damaging substances. Such encapsulation layers are described, for example, in the documents U.S. Patent Publication Nos. 2011/0121354 A1, 2011/0114992 A1 and 2011/0049730 A1, which in this regard are hereby expressly incorporated by reference. As an alternative thereto, it is also possible for the encapsulation layer to be formed, for example, by a glass layer, for example, a glass plate or a glass cover, which is applied above the organic functional layer stack 4 and the electrodes 2, 3 on the substrate 1.

The organic light-emitting components shown in the following exemplary embodiments have purely by way of example a construction shown in FIG. 1. Reference signs and references to individual layers of an organic light-emitting component may therefore relate to the described construction shown in FIG. 1.

FIG. 2 shows a lighting device 101 comprising an organic light-emitting component 100. In this case, the lighting device 101 is shown in a plan view, that is to say with a view of a luminous area 10 of the organic light-emitting component 100. In the case of the bottom emitter configuration shown in FIG. 1, the luminous area 10 is formed by the rear side of the substrate 1 facing away from the organic functional layer stack 4, such substrate correspondingly being embodied as transparent. The view shown in FIG. 2 is in this case a view through the substrate 1 looking at the layers and elements arranged on the substrate 1. If the organic light-emitting component 100 is embodied as a top emitter, FIG. 2 shows a plan view of a transparent encapsulation layer, for example, which is arranged on the side of the organic functional layer stack 4 facing away from the substrate 1 and which then forms at least in a partial region the luminous area 10 perceptible to an external observer.

Furthermore, electrical connection elements 71, 72 are arranged on the substrate 1, the electrical connection elements contacting the first electrode 2 in edge regions. If the first electrode 2 is arranged between the substrate 1 and the organic functional layer stack 4, then the electrical connection elements 71, 72 can be formed, for example, by regions of the first electrode 2 which project under the encapsulation layer 6 and extend over regions of the substrate 1 which are not covered by the organic functional layer stack 4.

As an alternative thereto, it may also be possible for the electrical connection elements 71, 72 to be formed by a different material than the first electrode 2, for example, layers or layer stacks comprising Cu, Cr, Mo, Al and/or Ag. If the first electrode 2 is that electrode which, as viewed from the substrate 1, is arranged above the organic functional layer stack 4, the first electrode can suitably extend over the organic functional layer stack 4 in order to electrically contact the electrical connection elements 71, 72 applied on the substrate.

The electrical connection elements 71, 72 can be directly contactable; for example, the electrical connection elements 71, 72 can form contact areas for bonding contacts, soldering contacts, electrically conductive adhesive contacts or plug contacts. Furthermore, it is also possible for the electrical connection elements 71, 72 to be electrically contacted by means of electrical conductor tracks running on the substrate 1 and/or by electrical vias extending through the substrate 1, such that an electrical connection of the organic light-emitting component can be carried out independently of the specific position of the electrical connection elements 71, 72, for example, by means of a contact strip arranged at a side edge or on a rear side of the substrate 1.

Furthermore, the organic light-emitting component 100 comprises at least one electrical connection element for the second electrode 3, this at least one electrical connection element not being shown for the sake of clarity.

The first and second electrodes 2, 3 and the organic functional layer stack 4 are embodied in a large-area fashion and in a continuous fashion, such that the luminous area 10 also is embodied in a large-area fashion and is continuous. Purely by way of example, the lighting device 101 or the organic light-emitting component 100 is embodied in a rectangular fashion, such that the luminous area 10 is also embodied in a rectangular fashion. The electrical connection elements 71, 72 contact the first electrode 2 in each case in edge regions on mutually opposite sides or at mutually opposite edges of the first electrode 2. In particular, the electrical connection elements in the present exemplary embodiment and also in the subsequent exemplary embodiments are arranged only in edge regions of the first electrode 2 and do not extend over the first electrode 2 and thus into the luminous region of the organic light-emitting component 100.

During the operation of the lighting device 101, different temporally varying voltages are applied to the at least two electrical connection elements 71, 72, as described in association with FIGS. 3A and 3G. For this purpose, an electrical component 8 is provided, which applies electrical voltages to the at least two electrical connection elements 71, 72 during the operation. The electrical component 8, as shown in FIG. 2, can be provided as an external component separate from the organic light-emitting component 100. As an alternative thereto, it is also possible for the electrical component 8 to be integrated, for example, in the form of an integrated circuit in the organic light-emitting component 100 and in this case to be arranged, for example, on or in the substrate 1.

A method for operating an organic light-emitting component 100 is described with reference to FIGS. 3A to 3G, which show simulations of a lighting device as illustrated in FIG. 2. FIGS. 3A to 3G only show the luminous area, which extends along an X-coordinate and a Y-coordinate for the purpose of the simulation carried out. The dimensions of the luminous area are in arbitrary units.

During operation, different temporally varying electrical voltages are applied to the electrical connection elements which adjoin the luminous area on the left and right and thus in the positive and negative X-direction, wherein the voltage difference between the electrical connection elements is designated in each case by $\Delta U$ in FIGS. 3A to 3G. The voltage differences $\Delta U$ shown in FIGS. 3A to 3G always relate to the voltage difference between the electrical connection elements rather than to the voltage respectively present between the electrical connection elements and the second electrode. In this case, the quantitative values indicated for $\Delta U$ are simulation-governed values and can assume other values in a real organic light-emitting component.

The electrical voltages which were applied to the electrical connection elements in the context of the simulation were chosen in such a way that the average electrical voltage applied to the first electrode remains constant. Depending on the current-voltage dependence and the current-brightness dependence of the organic light-emitting component 100, the electrical voltages applied to the electrical connection elements can also be chosen such that the average light intensity emitted by the organic light-emitting component remains constant in the case of non linear dependencies.

On account of the sheet resistance of the first electrode, a voltage drop dependent on the distance with respect to the electrical connection elements occurs in the first electrode. The second electrode, by contrast, is at a fixed electrical potential. As a result of the application of the electrical voltages to the electrical connection elements and the voltage drop in the first electrode, an electric current with a temporally and spatially varying current density distribution is fed into the at least one organic light-emitting layer, which current leads to a temporally and spatially varying luminance distribution depending on the current density distribution. The illustrated shading of the luminous area in each case indicates the brightness distribution in the states shown in FIGS. 3A to 3G. The lighter the shading, the higher the luminance, as can also be gathered from the scale on the right-hand side of FIGS. 3A to 3G. The numerical values above and below the scale indicate the absolute maximum and the absolute minimum of the simulated luminance.

The electrical voltages applied to the electrical connection elements are chosen with regard to their temporal variation purely by way of example such that the electrical voltage on one side is at its maximum if the electrical voltage on the other side is at its minimum. This state is shown in FIGS. 3A and 3G, in which the voltage difference ΔU between the left connection element and the right connection element, as assumed for the simulation, is +0.75 V and −0.75 V, respectively. In the state shown in FIG. 3A, therefore, the voltage applied to the left electrical connection element is at its maximum, while the voltage applied to the right electrical connection element is at its minimum, while the electrical voltages in the state shown in FIG. 3G are precisely the opposite.

The electrical voltages applied to the electrical connection elements oscillate periodically between a maximum value and a minimum value, wherein the oscillations, purely by way of example, are phase-shifted by half a period duration relative to one another. In the states shown in FIGS. 3B to 3F further luminance distributions are shown, which arise upon passing through the periods for the electrical voltages. It can be discerned here that the spatial luminance distribution becomes more homogeneous with a decreasing voltage difference ΔU between the electrical connection elements, while the inhomogeneity of the luminance distribution becomes greater with an increasing absolute value of the voltage difference ΔU. Upon continually passing through the states shown, this results in a wavy movement of the luminance homogeneity. The temporal variation of the electrical voltages can particularly preferably be chosen with regard to the temporal profile and the intensity of the voltage variation in such a way that the luminance changes are perceptible to the human eye, such that a temporally and spatially variable luminance distribution over the luminous area 10 that is perceptible to an observer is achievable. In particular, temporal changes with a frequency of less than or equal to 10 Hz or less than or equal to 5 Hz and greater than or equal to 0.5 Hz are particularly suitable.

FIGS. 4A and 4B show a further exemplary embodiment of a lighting device 102, wherein FIG. 4A shows a first state of the lighting device 102 at a first point in time and FIG. 4B shows a further state of the lighting device 102 at a second, later point in time. In comparison with the previous exemplary embodiment, the lighting device 102, with regard to which only the luminous area 10 and electrical connection elements 71 to 78 and also an electrical component 8 are shown, comprises round electrodes and a round organic functional layer stack and also a round luminous area 10. The electrical connection elements 71 to 78 are arranged in a manner spaced apart uniformly around the luminous area 10 and contact the first electrode in a circumferential edge region.

The electrical connection elements 71 to 78 are in each case separately drivable by the electrical component 8, as is indicated by means of the dashed arrow. In this case, a maximum electrical voltage is applied to one electrical connection element, for example, the electrical connection element 71 shown in FIG. 4A, while an ever lower electrical voltage in each case is applied progressively to the further electrical connection elements 72 to 78. Proceeding from the connection elements 71 as far as the connection element 78, a voltage difference ΔU is present between respectively adjacent connection elements, such that the luminance of the luminous area 10 continuously decreases in the radial direction in the course of a pass in the clockwise direction from the electrical connection element 71 to the electrical connection element 78. As a result, the luminance is largest in the region of the electrical connection element 71 in the state shown in FIG. 4A, as is indicated by the dashed lines within the luminous area 10.

At a later point in time, shown in FIG. 4B, the maximum voltage is applied to the electrical connection element 72, while a minimum voltage is applied to the electrical connection element 71. If this scheme is continued, a luminance distribution running in a circle is obtained. The electrical voltages respectively applied to the electrical connection elements 71 to 78 can in this case follow a sawtooth pattern, for example, which are temporally phase-shifted with respect to one another.

As an alternative thereto, other temporal profiles of the electrical voltages respectively applied to the electrical connection elements 71 to 78 are also possible. By way of example, the voltage variations can also be controlled by a random algorithm in order to prevent a familiarization effect or boredom. As a result, for example, wave movements at different speeds or luminance distributions running in a circle can be controlled by a random generator.

FIG. 5 shows a further exemplary embodiment of a lighting device 103 in different luminous states a) to e). The lighting device 103, with respect to which only the luminous area 10 of the organic light-emitting component 100 is shown for the sake of clarity, is embodied in the present exemplary embodiment as a turn-signal indicator for a front or rear lighting system of a motor vehicle such as an automobile, for instance, and has a rectangular shape in the exemplary embodiment shown. At a longitudinal side of the organic light-emitting component 100 in the exemplary embodiment shown, in an edge region, the lighting device 103 comprises five electrical connection elements 71, 72, 73, 74, 75 for contacting the first electrode of the organic light-emitting component 100, while the second electrode of the organic light-emitting component 100 is contacted by a continuous connection element (not shown) extending along the opposite longitudinal side. In particular, the first electrode contacted by the electrical connection elements 71, 72, 73, 74, 75 has a lower conductivity than the second electrode. Given an identical or substantially identical conductivity of the electrodes of the organic light-emitting component 100, it is also possible for both electrodes to be contacted by a plurality of connection elements. In the exemplary embodiment shown, the first electrode contacted by the electrical connection elements 71, 72, 73, 74, 75 is the anode of the organic light-emitting component 100, while the second electrode is the cathode.

In state a) of the lighting device 103, a voltage is applied only to the first electrical connection element 71 by means of a suitable electrical component (not shown), such that the luminous area 10 appears bright substantially only in the region of the first electrical connection element 71. The local brightness of the lighting device 103 was determined by a simulation, wherein an area of 1 cm×10 cm for the organic light-emitting component 100 was taken as a basis for this purpose. The scale depicted beside states a) to e) indicates the brightness of the corresponding exemplary simulation in $cd/m^2$.

In subsequent states b) to e), an electrical voltage is likewise applied progressively always to another of the electrical connection elements 72 to 75, such that an enlargement of the luminous area 10 from left to right is achieved by a temporal sequence of states a) to e) in the exemplary embodiment shown. By repeatedly passing through states a) to e) shown, for example, according to the pattern a-b-c-d- e-a-b-c-d-e- . . . or according to the pattern a-b-c-d-e-d-c-b-a-b-c-d-e-d- . . . , it is possible to produce a so-called sweeping turn-signal indicator.

In the configuration shown, the current consumption rises continuously in the course of passing through states a) to e). In the exemplary simulation, the current consumption is 45 mA, 75 mA, 105 mA, 132 mA and 152 mA in states a) to e). The switch-on process of the lighting device embodied as a turn-signal indicator as described here, that is to say the transfer of the turn-signal indicator from a non-luminous operating state to an operating state in which the turn-signal indicator is fully luminous, can be implemented in less than or equal to 200 ms, which is the maximum duration for the switch-on process as permitted by the standard.

While sweeping turn-signal indicators are usually formed by a plurality of different components, for example, by inorganic light-emitting diodes which are switched successively, as is described in the German Patent Publication DE 10 2011 119 230 B4, also published as U.S. Patent Publication No. 2013/0127612, the lighting device 103 described here makes it possible to use a single component, which enables a more attractive appearance in comparison with the use of a plurality of individual components. In particular, a continuous luminous progression without non-luminous webs or regions may also be possible as a result.

FIG. 6 shows a lighting device 104 in accordance with a further exemplary embodiment, wherein, in comparison with the previous exemplary embodiment in FIG. 5, electrical connection elements 71, 72, 73, 74 for electrically contacting the first electrode of the organic light-emitting component 100 are arranged in pairs at both longitudinal sides, while the second electrode of the organic light-emitting component 100 is contacted by connection elements (not shown) at the transverse sides. The organic light-emitting component 100 of the lighting device 104 has purely by way of example an area of 4 cm×26 m and generates yellow light with an average luminance of 8500 cd/m². If the complete organic light-emitting component 100 is switched on, the lighting device 104 generates a light intensity of 88.4 cd and still 61.8 cd at EOL ("end of life") and so such a lighting device can fulfil the standard for rear lights, which demands that a standard brightness of 60 cd must be achieved after 100 ms to at the latest 200 ms.

As already in the previous exemplary embodiment, a voltage is applied to the electrical connection elements 71 to 74 successively in states a) to d), such that a sweeping turn-signal indicator can likewise be achieved by repeatedly passing through the states shown.

In the configuration shown, the current consumption of states a) to d) rises continuously, as already in the previous exemplary embodiment. In the exemplary simulation, the current consumption is 0.97 A, 1.95 A, 2.46 A and 3.02 A in states a) to d). The complete switch-on process is concluded in 100 to 200 ms.

FIG. 7 shows the lighting device 104 in accordance with the previous exemplary embodiment, but the lighting device is operated in a different operating mode than the operating mode described in association with FIG. 6. In states a) to d) of the operating mode shown here, the organic light-emitting component 100 is operated in such a way that the luminance is 125% in comparison with the previous exemplary embodiment, but approximately 20% of the luminous area always remains dark and moves as a dark region. In this operating mode, therefore, the total current for all of states a) to d) is approximately identical or can be set identically. The speed of the pass movement of the dark region need not necessarily be predefined since the standard condition of at least 60 cd can always be fulfilled. Consequently, by way of example, at least one pass per turn-signal indicator cycle can be chosen. Alternatively, a pass in a time of less than 200 ms can also be chosen as in the previous exemplary embodiments.

FIG. 8 shows the lighting device 104 in a further operating mode, wherein the organic light-emitting component 100 is operated such that the luminance is 60% in comparison with the operating mode in FIG. 6, a voltage being applied successively alternately to the electrical connection elements 71 to 74, such that approximately 20% of the luminous area moves as a bright region. States a) and b) shown two of the four possible states of this operating mode.

FIG. 9 shows two states a) and b) of a further operating mode for the lighting device 104, this further operating mode being similar to the operating mode shown in FIG. 6, wherein here the organic light-emitting component 100 is operated such that the luminance is initially 50% in comparison with the operating mode in FIG. 6 and is raised in steps to 100%.

FIG. 10 shows two states a) and b) of a further operating mode for the lighting device 104, this further operating mode being similar to the operating mode shown in FIG. 7, wherein here the organic light-emitting component 100 is operated in such a way that the luminance is 110% in comparison with the exemplary embodiment in FIG. 6 and approximately 20% of the luminous area always remains dark and moves as a dark region.

The operating modes described above can be implemented with constant current or with constant voltage. In this case, the pass speeds through the respective states can be variable or else, if demanded by a standard, enable a minimum brightness, for example, in less than 200 ms. As an alternative to the above-described embodiments of the lighting devices 103 and 104 as sweeping turn-signal indicators, other luminous patterns and luminous sequences are also possible by means of a modification of the electrical driving.

Furthermore, as an alternative to the exemplary embodiments of the lighting device shown, the luminous area 10 of the organic light-emitting component 100 can also have any other arbitrary, unstructured and continuous shape. The number of electrical connection elements, the distribution thereof in edge regions of the first electrode and the temporally varying electrical voltages respectively applied can be chosen in accordance with the desired luminance variation.

The invention is not restricted to the exemplary embodiments by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A method for operating an organic light emitting component that comprises a first electrode, a second electrode, and an organic functional layer stack having an organic light emitting layer arranged between the first and second electrodes, wherein the first electrode has a higher electrical sheet resistance than the second electrode, wherein the first and second electrodes and the organic functional layer stack are embodied in a large-area fashion, and wherein edge regions of the first electrode are electrically contacted by a plurality of electrical connection elements, the method comprising:

applying different electrical voltages to the electrical connection elements; and temporally varying the different electrical voltages.

2. The method according to claim 1, wherein the second electrode is held at a fixed electrical potential.

3. The method according to claim 1, wherein temporally varying the different electrical voltages leads to a temporal and spatial variation of a luminance distribution of light emitted by the organic light emitting component.

4. The method according to claim 3, wherein the temporal and spatial variation is perceptible to an external observer.

5. The method according to claim 1, wherein an average voltage applied to the first electrode remains constant.

6. The method according to claim 1, wherein an average light intensity emitted by the organic light emitting component remains constant.

7. The method according to claim 1, wherein applying different electrical voltages to the electrical connection elements comprises applying oscillating electrical voltages.

8. The method according to claim 1, wherein applying different electrical voltages to the electrical connection elements comprises controlling the different electrical voltages according to a random algorithm.

9. The method according to claim 1, wherein the plurality of electrical connection elements are located in different edge regions of the first electrode.

10. The method according to claim 9, wherein applying the different electrical voltages to the connection elements comprises applying a temporally varying electrical voltage to ones of the electrical connection elements and applying a different temporally varying electrical voltage to other ones of the electrical connection elements.

11. The method according to claim 1, wherein the organic light emitting component comprises a luminous area having an angular shape, a corner of the luminous area being arranged between two of the electrical connection elements.

12. The method according to claim 1, wherein the organic light emitting component comprises a luminous area having a round shape.

13. The method according to claim 12, wherein the electrical connection elements are arranged in a manner spaced apart uniformly along the round shape.

14. A lighting device comprising:
an organic light emitting component; and
an electrical component,
wherein the organic light emitting component comprises a first electrode, a second electrode, and an organic functional layer stack having an organic light emitting layer arranged between the first and second electrodes,
wherein the first and second electrodes and the organic functional layer stack are embodied in a large-area fashion,
wherein edge regions of the first electrode are electrically contacted by a plurality of electrical connection elements,
wherein the electrical component is designed to apply different temporally varying electrical voltages to the electrical connection elements,
wherein the lighting device is a sweeping turn signal indicator for a motor vehicle, and
wherein a switch on process, until an operating state in which the turn signal indicator is fully luminous, is less than or equal to 200 ms.

15. A method for operating an organic light emitting component,
wherein the organic light emitting component comprises a first electrode, a second electrode, and an organic functional layer stack having an organic light emitting layer arranged between the first and second electrode,
wherein the first and second electrodes and the organic functional layer stack are embodied in a large-area fashion so that the organic light emitting component comprises a continuous luminous area in a large-area fashion that emits light generated in the organic light emitting layer in a large-area fashion,
wherein edge regions of the first electrode is electrically contacted by a plurality of electrical connection elements,
wherein all connection elements are arranged only in the edge regions of the first electrode and do not extend over the first electrode and into the luminous area of the organic light emitting component, and
wherein the luminous area is free of electrical contacts on an area of the first electrode and at a distance from the edge regions of the first electrode, the method comprising:
applying different electrical voltages to the electrical connection elements,
wherein the different electrical voltages vary temporally.

16. A method for operating an organic light emitting component that comprises a first electrode, a second electrode, and an organic functional layer stack having an organic light emitting layer arranged between the first and second electrodes, wherein the first and second electrodes and the organic functional layer stack are embodied in a large-area fashion, wherein edge regions of the first electrode are electrically contacted by a plurality of electrical connection elements, and wherein the plurality of electrical connection elements are located in different edge regions of the first electrode, the method comprising:
applying different electrical voltage to the electrical connection elements; and
temporally varying the different electrical voltages,
wherein applying the different electrical voltages to the connection elements comprises applying a temporally varying electrical voltage to ones of the electrical connection elements and applying a different temporally varying electrical voltage to other ones of the electrical connection elements.

\* \* \* \* \*